US012765668B2

(12) United States Patent
Hautala et al.

(10) Patent No.: US 12,765,668 B2
(45) Date of Patent: Oct. 20, 2026

(54) MOVABLE PROJECTOR CABINET

(71) Applicant: Artome Oy, Vierumäki (FI)

(72) Inventors: Joel Hautala, Vierumäki (FI); Toni Parikka, Vierumäki (FI); Riku Marttinen, Vierumäki (FI)

(73) Assignee: Artome Oy, Vierumaki (FI)

(*) Notice: Subject to any disclaimer, the term of this patent is extended or adjusted under 35 U.S.C. 154(b) by 28 days.

(21) Appl. No.: 18/036,933

(22) PCT Filed: Nov. 15, 2021

(86) PCT No.: PCT/EP2021/081707
§ 371 (c)(1),
(2) Date: May 15, 2023

(87) PCT Pub. No.: WO2022/106362
PCT Pub. Date: May 27, 2022

(65) Prior Publication Data

US 2024/0000227 A1 Jan. 4, 2024

(30) Foreign Application Priority Data

Nov. 18, 2020 (FI) .................................. 20208369.7

(51) Int. Cl.
*A47B 81/00* (2006.01)
*A47B 57/04* (2006.01)
(Continued)

(52) U.S. Cl.
CPC .............. *A47B 81/00* (2013.01); *A47B 57/04* (2013.01); *G03B 21/16* (2013.01); *G03B 21/54* (2013.01);
(Continued)

(58) Field of Classification Search
CPC ......... A47B 57/04; A47B 81/00; A47B 81/06; G03B 21/14; G03B 21/16; G03B 21/54;
(Continued)

(56) References Cited

U.S. PATENT DOCUMENTS 3,454,317 A * 7/1969 Salkind ................. A47B 37/02 312/21
4,440,457 A * 4/1984 Fogelman ........... G07F 17/3216 348/836
(Continued)

FOREIGN PATENT DOCUMENTS

CN 107146480 A 9/2017
CN 207008717 U 2/2018
(Continued)

OTHER PUBLICATIONS

International Search Report for International Patent Application No. PCT/EP2021/081707 dated Feb. 25, 2022 (3 pages).
(Continued)

*Primary Examiner* — James O Hansen
(74) *Attorney, Agent, or Firm* — Merchant & Gould P.C.

(57) ABSTRACT

A movable projector cabinet (1) in which a projector (10) can be set to inside the cabinet and operated from inside the cabinet so that the projector does not need to be moved from the cabinet for use.

14 Claims, 2 Drawing Sheets

(51) Int. Cl.

| | |
|---|---|
| ***G03B 21/16*** | (2006.01) |
| ***G03B 21/54*** | (2006.01) |
| ***G06F 3/16*** | (2006.01) |
| ***H04R 1/02*** | (2006.01) |
| ***H05K 7/20*** | (2006.01) |

(52) U.S. Cl.
CPC ............. *G06F 3/162* (2013.01); *H04R 1/028* (2013.01); *H05K 7/20209* (2013.01); *H04R 2499/15* (2013.01)

(58) Field of Classification Search
CPC ..... G06F 3/162; H04R 1/028; H04R 2499/15; H05K 7/20209
USPC ............................... 312/10.1; 353/15, 18, 19
See application file for complete search history.

(56) References Cited

U.S. PATENT DOCUMENTS

| | | | | | |
|---|---|---|---|---|---|
| 4,640,199 | A * | 2/1987 | Zigman | A47B 21/00 108/92 |
| 5,118,172 | A * | 6/1992 | Ugalde | A47B 21/00 108/143 |
| 5,210,603 | A * | 5/1993 | Sabin | G07F 17/28 348/157 |
| 5,364,177 | A * | 11/1994 | Ugalde | A47B 21/0073 312/194 |
| 5,584,554 | A * | 12/1996 | Moore | G09F 19/18 353/122 |
| 5,954,408 | A * | 9/1999 | Bogucki | A47B 21/00 248/419 |
| 5,980,004 | A * | 11/1999 | Shoenfeld | A47B 83/001 312/351 |
| 7,226,174 | B2 * | 6/2007 | Rodems | G03B 21/54 312/10.1 |
| 8,622,554 | B1 * | 1/2014 | Toutoungi | G03B 21/54 348/794 |
| 10,379,429 | B2 | 8/2019 | Rossell | |
| 10,609,472 | B2 * | 3/2020 | Huang | H04R 1/025 |
| 2005/0083486 | A1 * | 4/2005 | Johnson | H04N 9/3141 353/15 |
| 2008/0106173 | A1 | 5/2008 | Konopka | |
| 2011/0299045 | A1 * | 12/2011 | Kotani | B01D 46/681 353/57 |
| 2016/0198842 | A1 | 7/2016 | Kang et al. | |

FOREIGN PATENT DOCUMENTS

| | | | |
|---|---|---|---|
| CN | 208027233 | U | 10/2018 |
| CN | 210295448 | U | 4/2020 |
| CN | 210694219 | U | 6/2020 |
| CN | 210983011 | U | 7/2020 |
| CN | 211423733 | U | 9/2020 |
| CN | 211525895 | U | 9/2020 |
| CN | 211826881 | U | 10/2020 |
| CN | 211826882 | U | 10/2020 |
| JP | H07320094 | A | 12/1995 |
| JP | H085392 | A | 1/1996 |
| JP | 2003-250639 | A | 9/2003 |
| JP | 2009-031430 | A | 2/2009 |
| JP | 2010-217331 | A | 9/2010 |
| JP | 2019521375 | A | 7/2019 |
| WO | 2005114320 | A1 | 12/2005 |
| WO | 2016/036037 | A1 | 3/2016 |

OTHER PUBLICATIONS

Written Opinion of the International Searching Authority for International Patent Application No. PCT/EP2021/081707 dated Feb. 25, 2022 (5 pages).
Extended European Search Report for Application No. EP20208369.7 dated 30.04.21 (7 pages).
English Translation of Office Action dated Nov. 12, 2024 for the corresponding Japanese patent application No. 2023-527804, 3 pages.
Office Action dated May 15, 2025 for the corresponding Chinese Patent Application No. 202180077311.6 (18 pages including English Translation).
Office Action dated Jan. 21, 2026 for the corresponding Japanese Patent Application No. 2025-034384 (5 pages including English Translation).
Office Action dated Feb. 20, 2024 for the corresponding Japanese Application No. 2023-527804 (9 pages including English Translation).

* cited by examiner

MOVABLE PROJECTOR CABINET

CROSS-REFERENCE TO RELATED APPLICATIONS

This application is a National Stage Application of PCT/EP2021/081707, filed 15 Nov. 2021, which claims benefit of Serial No. EP20208369.7, filed 18 Nov. 2020, and which applications are hereby incorporated by reference in their entireties. To the extent appropriate, a claim of priority is made to each of the above disclosed applications.

FIELD OF THE INVENTION

The invention relates to a movable projector cabinet.

BACKGROUND OF THE INVENTION

A projector that display images by projecting projection light onto a screen or a wall or other reflective surface are generally known and widely used.

Conventionally projectors have been assembled as a fixed installation in various operation sites. This means a lot of installation work at the operation site. The fixed installation means that a certain space at the installation site is always reserved for the projector and audio devices. Also, a design, cabling and installation of audiovisual technology may be challenging, especially in large event spaces. There is a need for more flexible use of the projector in several different places of an operation site.

Even movable projectors and other related equipment need installation and set-up work before the projector and related equipment are ready for use. This takes time and often expert knowledge is needed for a user. Furthermore, there is a risk of damaging projector and related AV equipment during moving them from a storage to operation site.

A projector cabinet or a stand is known for accommodating a projector that projects an image on a screen or the like. In known solutions the projector is often placed on top of the cabinet or the stand for use, and there is a risk of dust adhering or theft when not in use. In some other solutions, when the projector is not in use, the projector can be stored inside the cabinet. However, the cabinet has a drawback that the operation is complicated because the projector must be moved from inside the cabinet to the top of the cabinet when the projector is set for use. There is often a need of space on the top of the cabinet for a device, like a computer, a laptop computer, tablet, media player etc., needed as an input device to the projector and audio devices.

A cooling of the projector is also an important factor. This has often substantially limited placing of the projector in the cabinet.

OBJECTIVE OF THE INVENTION

The objective of the invention is to alleviate the disadvantages mentioned above.

SUMMARY

The present invention provides a movable projector cabinet in which a projector can be set to inside the cabinet and operated from inside the cabinet so that the projector does not need to be moved from the cabinet for use. According to a first aspect, the present invention provides the movable projector cabinet, comprising a base, a plurality of castors, a first side wall extending from the base, a second sidewall extending from the base, and at a distance from the first side wall, a table plane arranged between the first side wall and the second side wall at a distance from the base, a front wall and back wall defining together a cabinet space.

According to the invention a projector space is arranged in the cabinet space between the base and the table plane and between the first side wall and the second side wall, and that a shelf defining a floor of the projector space is arranged at an inclination angle $\alpha$ in relation to a plane parallel to a base and configured to receive a projector on the shelf so that a lens of the projector is facing towards the front wall and that the lens can be arranged to extend through an opening arranged in the front wall.

The technical effect is that by arranging a projector space inside the cabinet an efficient solution for movable projector cabinet is achieved. Arranging a shelf at an inclination angle a suitable tilt angle for a projector is achieved and simultaneously this makes a shape and size of the projector space suitable for efficient cooling. Combined with a suitable projector the movable projector cabinet is a factory-made solution, which eliminates the design, cabling and installation of audiovisual technology, which is challenging, especially in large event spaces. With a movable projector cabinet having a AV system and a projector reduces the total cost of construction because the installation of AV technology in the operation site is eliminated, and the design of AV does not require special expertise.

The movable projector cabinet is characterized by what is stated in the independent claims.

Some other embodiments are characterized by what is stated in the other claims. Inventive embodiments are also disclosed in the specification and drawings of this patent application. The inventive content of the patent application may also be defined in other ways than defined in the following claims. The inventive content may also be formed of several separate inventions, especially if the invention is examined in the light of expressed or implicit sub-tasks or in view of obtained benefits or benefit groups. Some of the definitions contained in the following claims may then be unnecessary in view of the separate inventive ideas. Features of the different embodiments of the invention may, within the scope of the basic inventive idea, be applied to other embodiments.

In an embodiment of the movable projector cabinet the cabinet may further comprise at least one speaker and connecting means for connecting the projector or other audio source device to the at least one speaker. A speaker arranged in the cabinet makes the cabinet a compact AV solution and ready to use without an external speaker system.

In an embodiment of the movable projector cabinet the at least one speaker may be arranged on a back-wall side of the cabinet. The movable projector cabinet may be arranged in front of an audience and the speakers are directed towards the audience.

In an embodiment of the movable projector cabinet at least one fan may be arranged in the cabinet and configured to bring air into the projector space via openings arranged on the front wall and/or the side wall of the cabinet for cooling the projector space and exhaust the air from the projector space. By arranging at least one fan and circulating air through the projector space via openings an efficient cooling air flow is provided in the projector space.

In an embodiment of the movable projector cabinet the shelf may be arranged to the cabinet space so that a front edge of the shelf is at a greater distance from the plane of the base than a rear part of the shelf. This makes possible to fix the projector in a tilted position according to the inclination angle.

In an embodiment of the movable projector cabinet the inclination angle α of the shelf may be 8 to degrees. The inclination angle may be suitable for the projector and makes it possible to position the movable projector cabined near a screen and at the same time maintain a possibility to a relatively large projected image size, and especially a projected image height, on the screen.

In an embodiment of the movable projector cabinet the projector space may be a wedge-shaped space having a height increasing from a front wall side towards a back-wall side at least on a portion of the projector space. A generally wedge-shaped projector space may provide a possibility to efficiently bring cooling air flows to the projector space and at the same time keep the projector cabinet compact.

In an embodiment of the movable projector cabinet the fan may be arranged to draw air from the projector space and blow the air outside the cabinet. It is efficient to bring an under pressure (partial vacuum) in the projector space by a fan by drawing the cooling air through openings to the projector space and by blowing the warm air from the space.

In an embodiment of the movable projector cabinet the fan may be configured to achieve an air flow through openings of the front wall to bring cooling air to the projector space. It may be useful to bring cooling air to a lower, front side of the projector space wherein the air flow is directed to a position of the projector in the projector space.

In an embodiment of the movable projector cabinet a handle opening may be arranged in each of the side walls and providing a channel for air form outside of the projector cabinet to the projector space. The handle openings may be used for gripping points when moving the movable projector cabinet and during the operation of the projector they bring extra cooling air to the projector space.

In an embodiment of the movable projector cabinet the fan may be configured to achieve first air flows to the projector space through the openings of the front wall and second air flows to the projector space through the handle openings, said handle openings may be arranged in the side walls at a distance from the front wall. This makes it possible to bring cooling air into the projector space in at least two phases. In a first phase cooling air is brought via front wall openings and in a second phase more cool air is brought via handle openings to cool the already warm air coming from the front wall openings via the projector. This provides a feature that the output air of the projector space may be cooler when the cool air is mixed with the warm air in the projector space.

In an embodiment of the movable projector cabinet a temperature sensor may be arranged in the projector space and an operation of the fan may be configured to be controlled on a basis of a signal or information of the temperature sensor. This makes it possible to regulate the temperature and/or air flow of the projector space.

In an embodiment of the movable projector cabinet an operation panel may be arranged to an upper part of the cabinet. This makes it easy to use for the operator.

In an embodiment of the movable projector cabinet a connection panel may be arranged in the projector cabinet. In an embodiment some of the common connections may be arranged to the operation panel and some of connections to the connection panel arranged in a technical space of the movable projector cabinet.

In an embodiment of the movable projector cabinet the projector space of the projector cabinet may be configured to receive a laser projector, preferable a laser projector with a light output up to 20000 lumens. The movable projector cabinet and its projector space may be suitable projectors that may produce light up to 20000 lumens, which is enough for even the most challenging needs as well as bright spaces. Built-in sound system produces sufficient sound pressure for hundreds of people. The projector cabinet is also compatible with external sound systems.

In an embodiment the movable projector cabinet is designed for users with no technical background. In an embodiment the projector and AV system starts at the touch of a button and the operation panel contains only the most common operation buttons. A source device, such as a laptop computer or mobile device, may be connected with a cable or wirelessly.

It is to be understood that the aspects and embodiments of the invention described above may be used in any combination with each other. Several of the aspects and embodiments may be combined together to form a further embodiment of the invention.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

In the figures, some embodiments are shown simplified for the sake of clarity. Similar parts are marked with the same reference numbers in the figures.

DETAILED DESCRIPTION

Figure 1:
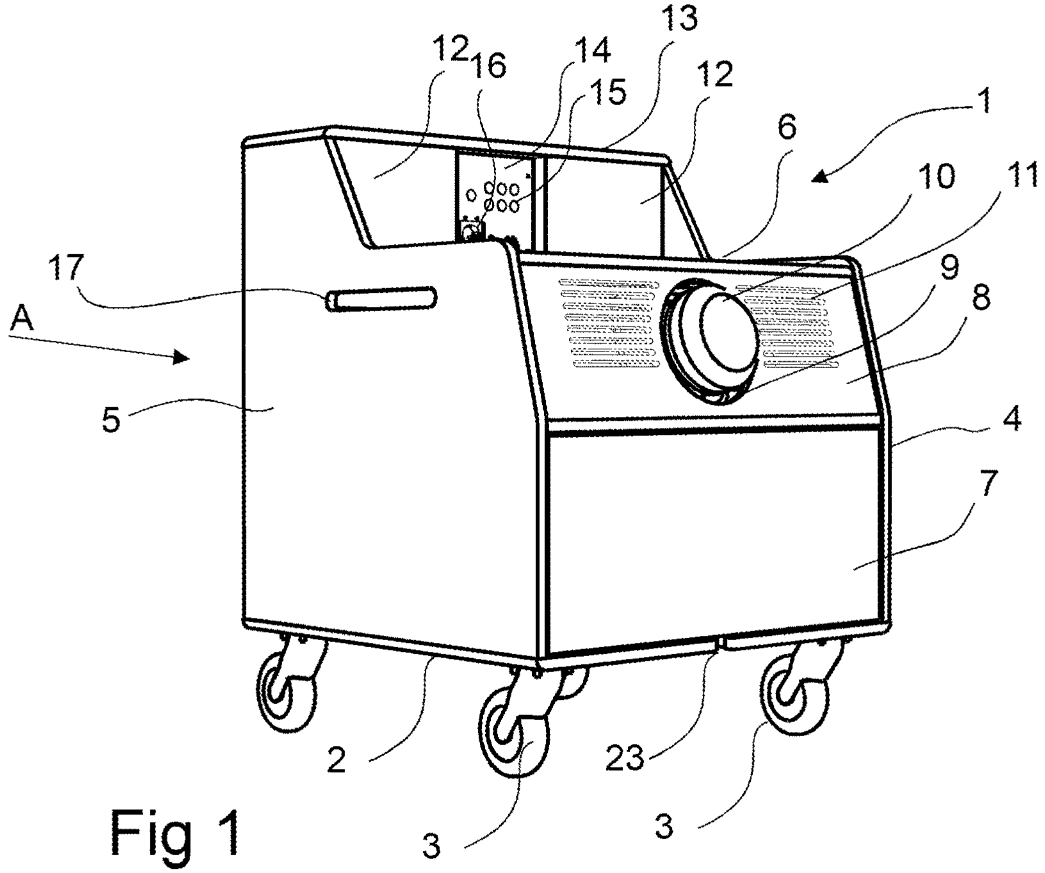
FIG. 1 is a schematic representation of a perspective view of an embodiment of a projector cabinet from a first direction, from the direction of arrow B in FIG. 2.
Figure 2:
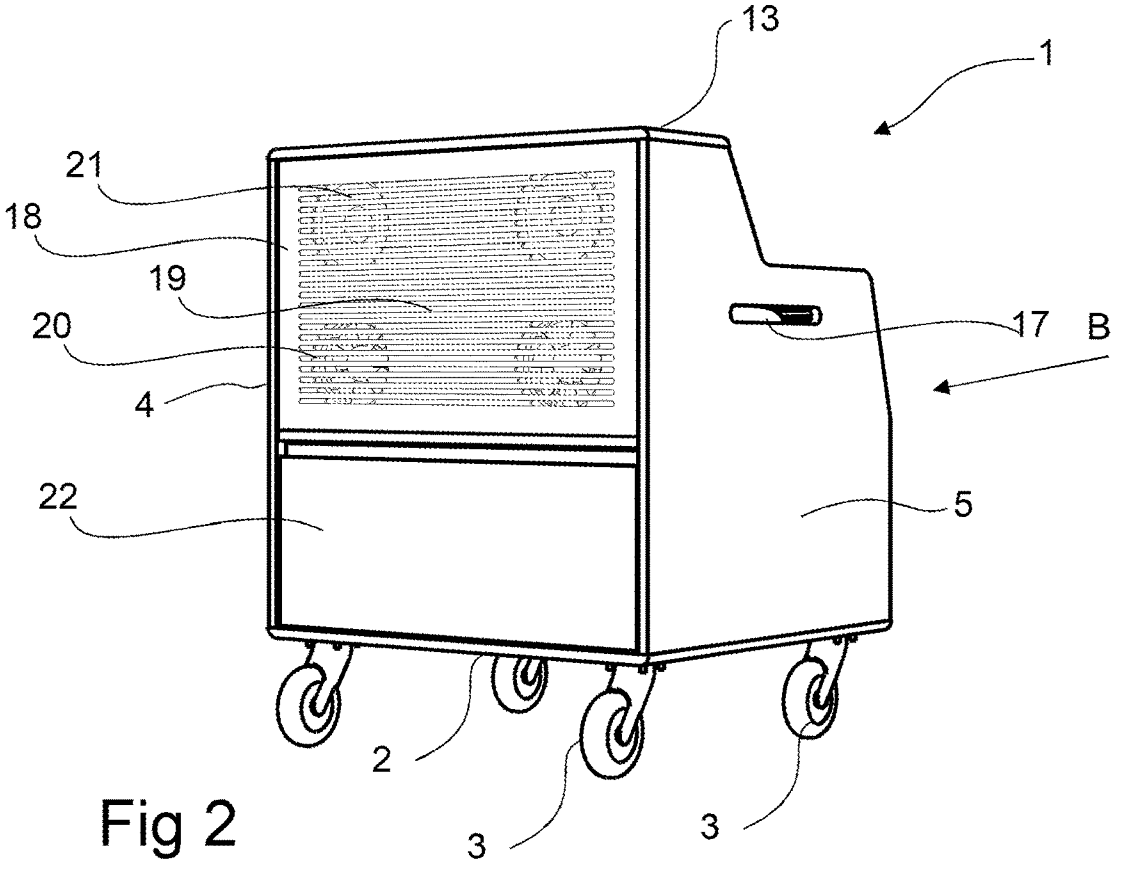
FIG. 2 is a schematic representation of a perspective view of an embodiment of a projector cabinet from a second direction, from the direction of arrow A in FIG. 1.
Figure 3:
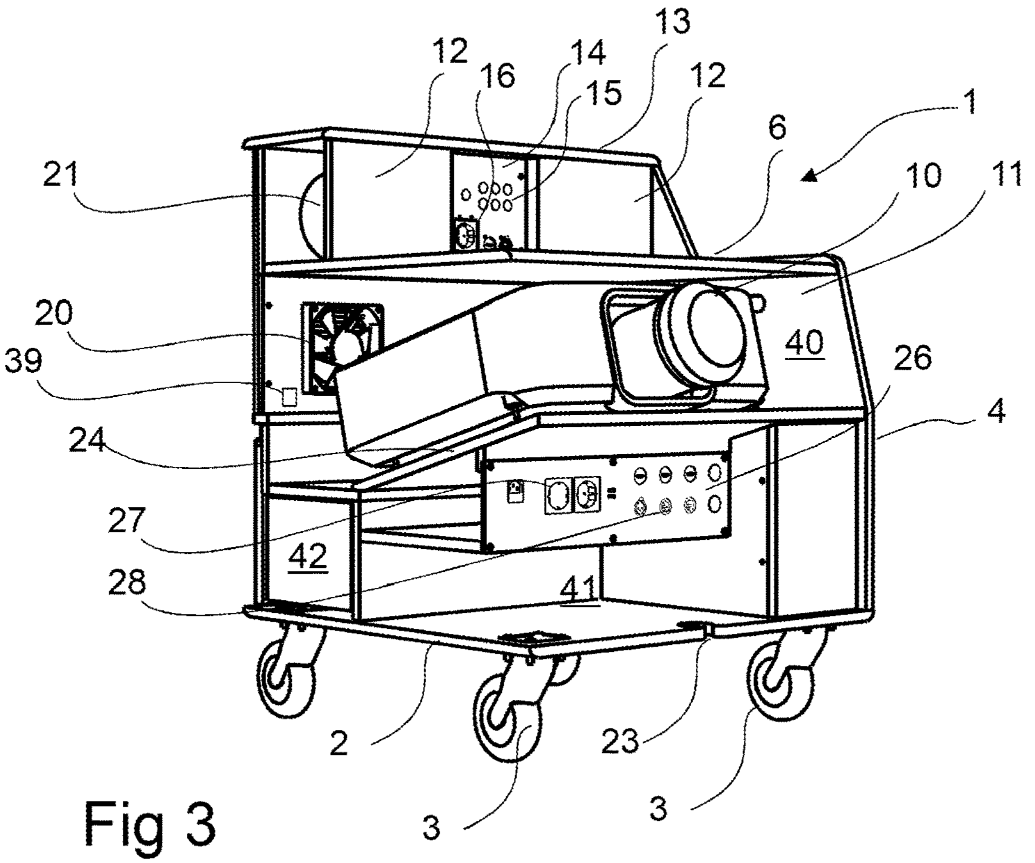
FIG. 3 is a schematic representation of a perspective view of an embodiment of a projector cabinet from a first direction, and a side wall, a front wall and a front panel removed.
Figure 4:
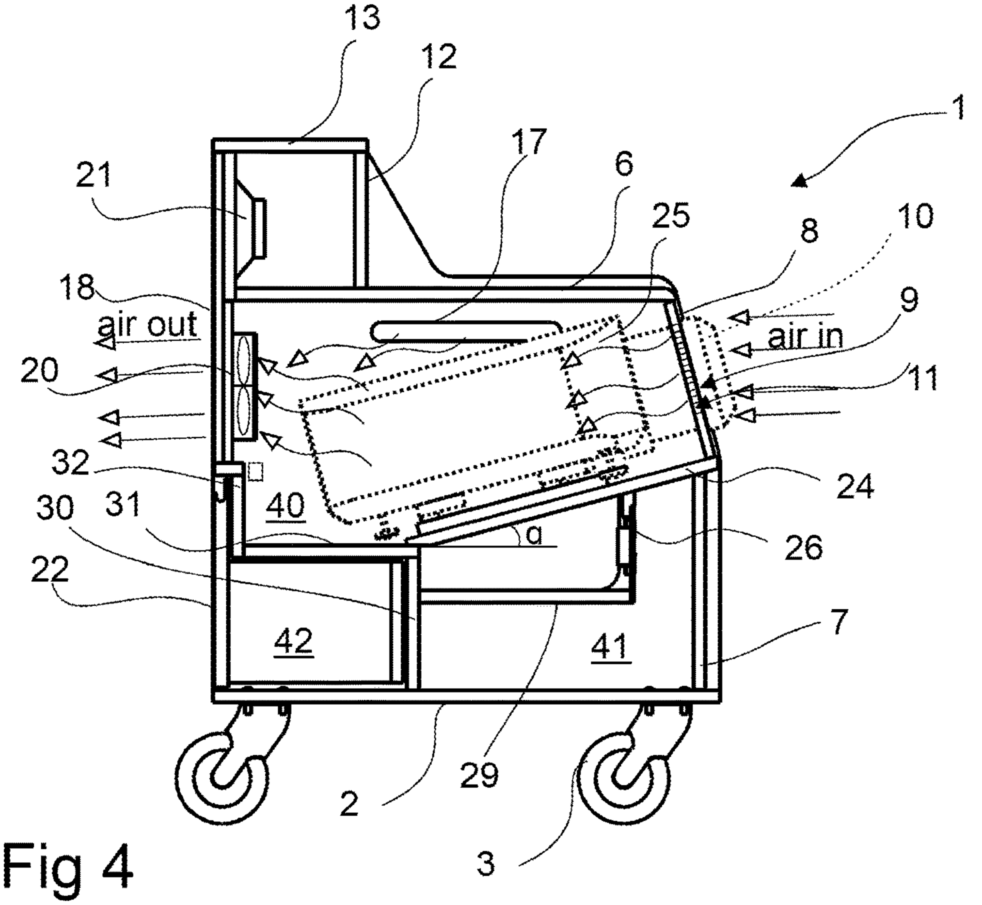
FIG. 4 is a schematic representation of a side view of an embodiment of a projector cabinet, and a side wall removed.

A diagrammatic illustration of a projector cabinet 1 is depicted in FIGS. 1 to 4. The projector cabinet 1 includes a base 2. In an embodiment the base 2 may be a base board-like member. Casters 3 may be arranged at the bottom surface of the base 2. The projector cabinet 1 may be moved on a support surface on casters in left-right, front-rear and diagonal direc-ions and also turned in all directions of 360 degrees. In an embodiment the casters 3 may be provided at four corners on the bottom surface of the base 2. The casters 3 make it possible to move the cabinet 1 together with the projector 10.

A brake may be provided on the casters 3. The brake may prevent the cabinet 1 from moving when needed, for example when the projector 10 is in use.

In an embodiment the cabinet 1 may comprise a first side wall 4 perpendicular with the base 2 and extending upwards from the upper surface of the base 2. In an embodiment the cabinet 1 may comprise a second side wall 5 at a distance from the first side wall 4, perpendicular with the base 2 and extending upwards from the base 2.

In an embodiment the cabinet may comprise a table plane 6 at a distance from the base 2 and substantially parallel with of the base 2. In an embodiment the table plane 6 may be a table board or other board-like member.

In an embodiment of the projector cabinet 1 a projector space 40 may be arranged in a cabinet space between the base 2 and the table plane 6 and between the first side wall 4 and the second side wall 5. A shelf 24 may be arranged between the first side 4 wall and the second side wall 5 and at a distance from the upper surface of the base 2. In an embodiment the shelf 24 may be arranged at an angle α in relation to a plane parallel to a base 2. In an embodiment a front edge of the shelf 24 is at a longer distance from the plane of the base than a rear part of the shelf. In an embodiment an angle α of inclination of the shelf 24 may be 8 to 20 degrees. In an embodiment an angle α of inclination of the shelf 24 may be 10 to 16 degrees, preferably 13 to 15 degrees. In an embodiment an angle α of inclination of the shelf 24 may be 15 degrees. The projector 10 may be arranged on the shelf 24 so that lens of the projector 10 may be arranged to extend through the opening 9 of the front wall 8.

In an embodiment the projector space 40 may be defined by an upper surface of the shelf 24, a lower surface of the table plane 6, an inner surface of the first side wall 4 and an inner surface of the second side wall 5. On a front side of the projector cabinet 1 may be arranged a front wall 8. The front wall 8 may be extending between a front edge of the shelf 24 and a front edge of the table plane 6. In an embodiment the front wall 8 may be arranged to extend towards table plane 6 in a perpendicular direction from the plane of the shelf 24. In a plane parallel of the base the front wall 8 may be extending from the first side wall 4 to the second side wall 5. In an embodiment the front wall may have an opening 9 for a lens of the projector 10. In an embodiment the front wall 9 may comprise openings 11 for intake air, for cooling the projector 10. The openings 11 may be arranged from outside of the cabin to the projector space 40 of the cabinet. In an embodiment the openings 11 may be in form of slots. In an embodiment the openings 11 may be arranged on a front wall 8 adjacent to the opening 9 for the lens of the projector 10 and at a distance from the opening 9. In an embodiment the openings 11 may be arranged as an array of slots parallel to a plane of the shelf 24 and arranged at a distance perpendicular to said plane of the shelf. In an embodiment the openings may be arranged to other suitable form and pattern. In an embodiment an air filter may be arranged in connection with the openings 11. In an embodiment a mesh may be arranged in connection with the openings 11.

The shelf 24 may be arranged to extend from the front wall 8 towards a back wall 18 of the projector cabinet 1. In an embodiment a height of the projector space 40 may be arranged to increase at least on a portion of the distance of the projector space extending from a front wall towards the back wall. This means that there may be arranged more free space between the projector and the upper wall (table plane) of the projector space 40 in the portion next to the back wall than in the portion of the projector space next to the front wall.

In an embodiment a fan 20 may be arranged to draw air from the projector space and blow the air outside the cabinet. In the FIG. 4 white headed arrows illustrate schematically flow of air to the cabinet 1, in the projector space 40, and outflow of air from the cabinet. In an embodiment an opening 19 may be arranged to the back wall from the projector space through the back wall at a point of the fan 20 for conveying air from the projector space outside the projector space. In an embodiment the fan during its operation sucks air from the projector space. In an embodiment the fan may be configured to achieve an air flow through the openings 11 of the front wall 8 to bring cooling air to the projector. In an embodiment the air may be flow through a cooling system of the projector and the air, that may be warming during a cooling phase of the projector, may be discharged to the portion of projector space next to back wall. There the warm air flow coming from the projector may be mixed with a flow of cool air coming from handle openings 17 of the first and second side walls 4, 5. In an embodiment an efficient cooling airflow may be achieved with the fan 20 in the projector space 40 through the openings 11 of the front wall. In an embodiment a second cooling air flow may be achieved by the fan 20 in the projector space through the handle openings 17 arranged at a distance from the front wall in the side walls 4, 5 and through the side walls from outside the cabinet to the projector space 40. In an embodiment a wedge type portion of the projector space may be arranged widening at least its height from the front wall 8 towards the back wall 18. The shape of the projector space 40 achieved with help of the inclined shelf 24 and the configuration of the openings 11, 17 of the projector cabinet and the at least one fan 20 provides an efficient cooling air flows, which make possible to place the projector 10 in the projector space of the cabinet and use of the projector without taking it out from the projector space. In an embodiment a temperature sensor 39 may be arranged to the projector space 40 and a rotation of the fan 20 may be configured to controlled on a basis of the temperature measured by the temperature sensor 39. In an embodiment optionally also the operation of the projector 10 may be configured to be controlled on a basis of the temperature measured by the temperature sensor 39.

In an embodiment the cabinet may comprise a plurality of fans 20. In an embodiment of the figures two fans 20 two fans may be arranged on the back wall 18 of the cabinet in connection with the projector space 40. In an embodiment a cover panel, a lattice, a grill or a mesh may be arranged to the back wall 18. In an embodiment the cover, lattice, grill or mesh may be arranged to the cabinet by a quick-release coupling. In an embodiment the quick-release coupling of the cover panel may be arranged by magnets and their counter parts.

In an embodiment an operation panel 14 may be arranged to the projector cabinet. In an embodiment the operation panel may be arranged on an upper part of the projector cabinet. In an embodiment the upper part may extend at a distance perpendicular from the plan of the table plane 6. The upper part may have an upper part front wall 12 and a top wall 13. The first and second side wall may each have a top portion extending to the top wall 13 of the upper part. The back wall 18 of the projector cabinet may extend to the top wall 13 of the upper part. In an embodiment of the projector cabinet at least one speaker 21 may be arranged in the projector cabinet. In an embodiment a pair of speakers 21 may be arranged in the projector cabinet. In an embodiment the speaker 21 may be arranged on the back wall 18 of the projector cabinet. In an embodiment the speaker 21 or speakers may be arranged on the upper part of the projector cabinet.

In an embodiment the operation panel 14 may be arranged on the upper part of the projector cabinet. In an embodiment the operation panel 14 may be arranged on a front wall 12 and/or on a top wall 13 of upper part of the projector cabinet. In an embodiment the operation panel may be embedded to the front wall and/or to the top wall of the upper part of the projector cabinet. In an embodiment a front surface of the operation panel 14 may be embedded at a distance inwards from a plane of the front wall 12 of the upper part of the projector cabinet. The operation panel may comprise at least one or more of the following: on-off switch 15, volume up/down button(s), video signal in, HDMI, Mic/Line in, SPDIF in/out, several programmable user buttons, for example source, freeze, mute, pause. The operation panel may have power outlet 16. In an embodiment the operation panel 14 may comprise a touch screen.

In an embodiment a connecting panel 26 may be arranged in the projector cabinet. In an embodiment the connecting panel may comprise mains in connection 27. In an embodiment the connecting panel 26 may further comprise other input/output connection points for power, sound and information. In an embodiment the connecting panel 26 may be arranged in the projector cabinet into a technical space 41. In an embodiment the technical space 41 may be arranged between the base 2 and the shelf 24 in the projector cabinet. In an embodiment the connecting panel may be arranged on connection rails arranged in the technical space. In an embodiment the technical space 41 may be provided by a closing member, such as a door 7. In an embodiment the closing member of the technical space may be arranged on a front wall side of the projector cabinet. In an embodiment an opening 23 may be arranged on the cabinet for a power cable. In an embodiment the opening 23 may be arranged through a base 2. In an embodiment the opening may be arranged on a front edge area of the base.

In an embodiment a further storage space 42 may be arranged in the projector cabinet. In an embodiment a drawer 22 may be arranged on the back-wall part of the projector cabinet.

In an embodiment partition walls 29, 30, 31, 32 may be arranged to separate the different spaces 40, 41, 42 of the projector cabinet.

In the figures a cabling of different devices of the cabinet, such as the operation panel 14, the connection panel 26, the speaker 21, the projector 10 and possible other devices are not shown in the sake of clarity of the figures.

In an embodiment the projector space 40 of the projector cabinet may be configured to receive a laser projector, preferable a laser projector with a light output up to 20000 lumens. In an embodiment an image and sound can be optimized for different sized spaces. In an embodiment an AV technology of the movable projector cabinet and the projector optimized for the gym can be converted for conference use without the need for reprogramming or installation.

In an embodiment the movable projector cabinet may transform a gymnasium for festive use and a lobby as an exhibition space. The movable projector cabinet can be used for several different purposes, resulting in a high utilization rate of AV technology.

At the design phase, the light output of a laser projector can be determined according to the requirements of room brightness and image size. In an embodiment of the movable projector cabinet its sound system can be expanded to meet the needs of events by selecting appropriate connections and features for the solution.

It is obvious to a person skilled in the art that with the advancement of technology, the basic idea of the invention may be implemented in various ways. The invention and its embodiments are thus not limited to the examples described above, instead they may vary within the scope of the claims.

The invention claimed is:

1. A movable projector cabinet, comprising a base, a plurality of castors, a first side wall extending from the base, a second sidewall extending from the base, and at a distance from the first side wall, a table plane arranged between the first side wall and the second side wall at a distance from the base, a front wall and back wall defining together a cabinet space, wherein an operation panel is arranged on an upper part of the projector cabinet, wherein the operation panel comprises at least one or more of the following: on-off switch, volume up-down button(s), video signal in, HDMI, Mic/Line in, SPDIF in/out, programmable user buttons, power outlet, and/or touch screen, wherein the upper part extends at a distance perpendicular from the table plane, the upper part comprising an upper part front wall and a top wall, wherein the first and second side wall each have a top portion extending to the top wall of the upper part, and wherein the back wall of the projector cabinet extends to the top wall of the upper part, and wherein a projector space is arranged in the cabinet space between the base and the table plane and between the first side wall and the second side wall, and that a shelf defining a floor of the projector space is arranged at an inclination angle in relation to a plane parallel to the base and configured to receive a projector on the shelf so that a lens of the projector is facing towards the front wall and that the lens can be arranged to extend through an opening arranged in the front wall, and wherein the projector space has a base area that is greater than a base area of the upper part.

2. The movable projector cabinet according to claim 1, wherein the cabinet comprises further at least one speaker and connecting means for connecting the projector or other audio source device to the at least one speaker.

3. The movable projector cabinet according to claim 1, wherein the at least one speaker is arranged on the back wall side of the cabinet.

4. The movable projector cabinet according to claim 1, wherein at least one fan is arranged in the cabinet and configured to bring air into the projector space via openings arranged on the front wall and/or the side wall of the cabinet for cooling the projector space and exhaust the air from the projector space.

5. The movable projector cabinet according to claim 1, wherein the shelf is arranged to the cabinet space so that to a front edge of the shelf is at a greater distance from the plane of the base than a rear part of the shelf.

6. The movable projector cabinet according to claim 1, wherein the inclination angle of the shelf is 8 to 20 degrees.

7. The movable projector cabinet according to claim 1, wherein the projector space is a wedge-shaped space having a height increasing from a front wall side towards a back-wall side at least on a portion of the projector space.

8. The movable projector cabinet according to claim 1, wherein a fan is arranged to draw air from the projector space and blow the air outside the cabinet.

9. The movable projector cabinet according to claim 1, wherein a fan is configured to achieve an air flow through openings of the front wall to bring cooling air to the projector space.

10. The movable projector cabinet according to claim 1, wherein a handle opening is arranged in each of the side walls, and providing a channel for air form outside of the projector cabinet to the projector space.

11. The movable projector cabinet according to claim 1, wherein a fan is configured to achieve first air flows to the projector space through openings of the front wall and second air flows to the projector space through handle openings, said handle openings are arranged in the side walls at a distance from the front wall.

12. The movable projector cabinet according to claim 1, wherein a temperature sensor is arranged in the projector space and an operation of a fan is configured to be controlled on a basis of a signal or information of the temperature sensor.

13. The movable projector cabinet according to claim 1, wherein a connection panel is arranged in the projector cabinet.

14. The movable projector cabinet according to claim 1, wherein the projector space of the projector cabinet is configured to receive a laser projector.

* * * * *